United States Patent
Patil et al.

(10) Patent No.: US 11,999,006 B2
(45) Date of Patent: Jun. 4, 2024

(54) DIAMOND ROTORS FOR MAS-NMR

(71) Applicant: Massachusetts Institute of Technology, Cambridge, MA (US)

(72) Inventors: Prashant Patil, Cambridge, MA (US); Daniel Banks, Cambridge, MA (US); Salima Bahri, Somerville, MA (US); William Langford, Cambridge, MA (US); Camron Blackburn, Cambridge, MA (US); Zachary Fredin, Cambridge, MA (US); Robert Griffin, Cambridge, MA (US); Neil Gershenfeld, Cambridge, MA (US)

(73) Assignee: Massachusetts Institute of Technology, Cambridge, MA (US)

(*) Notice: Subject to any disclaimer, the term of this patent is extended or adjusted under 35 U.S.C. 154(b) by 756 days.

(21) Appl. No.: 17/098,359

(22) Filed: Nov. 14, 2020

(65) Prior Publication Data

US 2021/0146475 A1    May 20, 2021

Related U.S. Application Data

(60) Provisional application No. 62/935,602, filed on Nov. 14, 2019.

(51) Int. Cl.
*B23K 26/00* (2014.01)
*B23K 26/55* (2014.01)
(Continued)

(52) U.S. Cl.
CPC .......... *B23K 26/0006* (2013.01); *B23K 26/55* (2015.10); *B28D 5/0058* (2013.01);
(Continued)

(58) Field of Classification Search
CPC .. G01R 33/307; B28D 5/0082; B25D 5/0058; B23K 26/55; B23K 26/0006; B23K 2103/50; B23K 26/40
(Continued)

(56) References Cited

U.S. PATENT DOCUMENTS

| 5,190,024 A | 3/1993 | Senanayake |
| 2007/0186918 A1 | 8/2007 | Ceulemans |
| 2018/0360175 A1* | 12/2018 | Hosseini ............. A44C 17/001 |

FOREIGN PATENT DOCUMENTS

| EP | 1983080 | 10/2008 |
| EP | 2868421 | 5/2015 |
| RU | 2556177 C1 * | 7/2015 |

OTHER PUBLICATIONS

International Search Report for Application PCT/US 2020/060630, dated Apr. 1, 2021, 4 Pages.
(Continued)

*Primary Examiner* — Katina N. Henson
(74) *Attorney, Agent, or Firm* — Dunlap Bennett & Ludwig, PLLC

(57) ABSTRACT

A method for fabricating MAS NMR rotors and drive caps made of diamond to increase the maximum achievable spinning frequency and enhance MAS NMR sensitivity and resolution. Diamond is an excellent choice for making MAS NMR rotors due to its high tensile and flexural strength, however, micromachining diamond is difficult due to its hardness. Although laser cutting is often employed to cut diamond sheets, this process cannot be used to create the high aspect ratio and small features required for MAS NMR rotors. In the present invention, a laser micromachining process is used to create the desired high aspect ratio while maintaining the small lateral features. In this process, the laser is used to first convert the diamond into graphite followed by a conversion to carbon dioxide in the presence (Continued)

of oxygen. To create a rotor, a rectangular log has a center hole drilled by the laser, and is then micromachined into a hollow cylinder.

19 Claims, 6 Drawing Sheets

(51) Int. Cl.
  *B28D 5/00* (2006.01)
  *G01R 33/30* (2006.01)
  *B23K 103/00* (2006.01)
(52) U.S. Cl.
  CPC ......... *B28D 5/0082* (2013.01); *G01R 33/307* (2013.01); *B23K 2103/50* (2018.08)
(58) Field of Classification Search
  USPC ...................................................... 125/30.01
  See application file for complete search history.

(56) References Cited

OTHER PUBLICATIONS

Written Opinion of the International Searching Authority for Application PCT/US 2020/060630, dated Apr. 1, 2021, 5 Pages.
E.B. Shershnev, "Computer simulation of diamond laser processing. Information technologies in education, science and production." V International Scientific and Technical Internet Conference. Nov. 18-19, 2017, 4 Pages, Section Information Technologies in Production and Scientific Research [online].
Knowles et al., "The amyloid state and its association with protein misfolding diseases," Nature Reviews Molecular Cell Biology, vol. 15, No. 6, Jun. 2014, pp. 384-396.
Jang et al., "New structures help the modeling of toxic amyloidll ion channels," Trends in Biochemical Sciences, vol. 33, Issue 2, Feb. 2008, pp. 91-100. [Abstract Only].
Andrew et al., "Nuclear magnetic resonance spectra from a crystal rotated at high speed," Nature, vol. 182, No. 4650, Dec. 13, 1958, p. 1658.
Cohen et al., "Physical Review Letters Free Induction Decays of Rotating Solids," Phys. Rev. Lett, vol. 2, No. 7, p. 71, 1957.
Jaroniec et al., "High-resolution molecular structure of a peptide in an amyloid fibril determined by magic angle spinning NMR spectroscopy," Proceedings of the National Academy of Sciences of the United States of America, vol. 101, No. 3, Jan. 20, 2004, pp. 711-716.
Robert Tycko, "Solid State NMR Studies of Amyloid Fibril Structure," Annual Review of Physical Chemistry, vol. 62, No. 1, May 2011, pp. 24.
Bockmann et al., "Spinning proteins, the faster, the better?," Journal of Magnetic Resonance, vol. 253, 2015, pp. 26.
Polenoval et al., "Magic Angle Spinning NMR Spectroscopy: A Versatile Technique for Structural and Dynamic Analysis of Solid-Phase Systems," American Chemical Society, vol. 25, No. 3, Mar. 20, 2015, pp. 5458-5469.
Penzel et al., "Spinning faster: protein NMR at MAS frequencies up to 126 kHz," Journal of Biomolecular NMR, vol. 73, No. 1-2, Jan. 24, 2019, pp. 19-29.
Bouleau et al., "Pushing NMR sensitivity limits using dynamic nuclear polarization with closed-loop cryogenic helium sample spinning," Chemical Science, DOI: 10.1039/c5sc02819a, vol. 6, No. 12, pp. 6806-6812, 2015.
Wendell H. Potter, "Apparatus to Rotate Samples Rapidly at Temperatures Less Than 2 K in High Transverse Magnetic Fields," Review of Scientific Instruments, vol. 42, No. 5, 1971, pp. 618-625. [Abstract Only].
S. Wegner, Solid State NMR News and Updates, accessed Aug. 10, 2019. https://www.bruker.com/fileadmin/user_upload/8-PDF-Docs/MagneticResonance/Events_NMR/UM_DE18/Solid_State_NMR_Workshop_2.pdf.
Jensen et al., "Brookhaven national laboratory selected cryogenic data notebook", Sections I-IX, vol. I, Brookhaven National Laboratory, 1980, pp. 557.
Olson et al., "Tensile strength of synthetic chemical-vapor-deposited diamond," Journal of Applied Physics, vol. 78, No. 8, 1995, pp. 5177-5179. [Abstract Only].
Hamlin et al., U. Kingdom Atomic Energy Authority, "Separation of Uranium by Reversed Phase Partition Chromatography", Feb. 20, 1960, Nature, vol. 185, p. 527-528, 1960. [Abstract Only].
Vita et al., "A microscopic model for surface-induced diamond-to-graphite transitions," Nature, vol. 379, Feb. 8, 1996, pp. 523-526. [Abstract Only].

* cited by examiner

DIAMOND ROTORS FOR MAS-NMR

This application is related to, and claims priority from U.S. Provisional Patent Application No. 62/935,602 filed Nov. 14, 2019. Application 62/935,602 is hereby incorporated by reference in its entirety.

BACKGROUND

Field of the Invention

The present invention relates generally to creation of high aspect ratio structures and more particularly to a laser micromachining method that uses diamond as a starting material for these structures.

Description of the Problem Solved

Amyloid fibrils are filamentous structures associated with more than fifty debilitating diseases including Alzheimer's, Parkinson's, and Huntington's among others.[1] Obtaining atomic-resolution 3D structures of amyloid fibrils is essential for developing a cure for these diseases. [2] Acquiring this structural information using classical methods such as electron microscopy, atomic force microscopy, x-ray crystallography, and solution-state NMR spectroscopy is challenging as amyloid fibrils are inherently non-crystalline, insoluble and lack 3D order.

Recent advances in magic angle spinning (MAS) [3, 4] solid-state NMR spectroscopy have enabled the determination of 3D structures for many amyloid fibrils.[5, 6] In MAS NMR, the sample of interest is rotated about an axis tilted at the magic angle (54.74°) with respect to a static magnetic field. This rotation results in the averaging of many anisotropic nuclear interactions, leading to narrower spectral lines and thus increased resolution and sensitivity. The resolution obtained in MAS NMR is greatly dependent upon the spinning frequency of the NMR rotor. [7] Currently, the spinning frequency of state-of-the-art MAS probes and rotors is limited to ~110 kHz-140 kHz [8, 9], resulting in limitations of MAS NMR resolution compared to other methods.

The maximum spinning frequency of MAS rotors depends upon the fluid properties of the driving gas and is limited by the tensile and flexural strength of the rotor material as well as the surface speed of the spinning rotor, which cannot exceed the speed of sound of the driving gas medium.[10, 11] An approximate maximum theoretical MAS frequency limit for rotors with various diameters currently employed in MAS NMR can be seen in FIG. 1. The theoretical limit is calculated using the speed of sound in helium as a function of temperature.[12] The theoretical frequency limit under MAS is inversely proportional to rotor diameter. For 0.7 mm MAS rotors, the smallest diameter rotor currently employed commercially, the maximum theoretical spinning frequency is approximately 455 kHz. However, in practice, the spinning frequency is limited by the tensile and flexural strength of the zirconia material used for fabricating rotors. It would be extremely advantageous to use diamond with its much higher tensile and flexural strength instead of zirconia to achieve much higher spinning frequencies. However, it is very difficult to machine diamond into high aspect ratio structures.

SUMMARY OF THE INVENTION

The present invention relates to a laser micromachining process to micro-machine high aspect ratio microstructures in diamond. The machining method cuts the diamond by using laser-induced graphitization of diamond followed by oxidation of newly formed graphite to remove it. This allows the fabrication of the high aspect ratio structures. A trace or cut is made in the diamond by turning the diamond material along the path into graphite using a low-energy pulsed laser beam. Next, the graphite is oxidized into carbon dioxide or carbon monoxide by using the laser in the presence of atmospheric oxygen. The high aspect ratio is achieved by selecting a wavelength with sufficiently low absorption to allow for a large optical penetration depth, but still absorptive enough to cause sufficient heating. Once the laser light is absorbed by the diamond, it causes a phase change resulting in graphitization of the diamond. The absorption coefficient of graphite is much greater than that of diamond resulting in a sudden increase in laser absorption, and an increase in temperature. This causes the graphite to be oxidized to form carbon dioxide or carbon monoxide leading to high material removal rate.

DESCRIPTION OF THE FIGURES

Attention is now directed to several figures that illustrate features of the present invention.

Several drawings and illustrations have been presented to aid in understanding the present invention. The scope of the present invention is not limited to what is shown in the figures.

DESCRIPTION OF THE PREFERRED EMBODIMENTS

Figure 1:
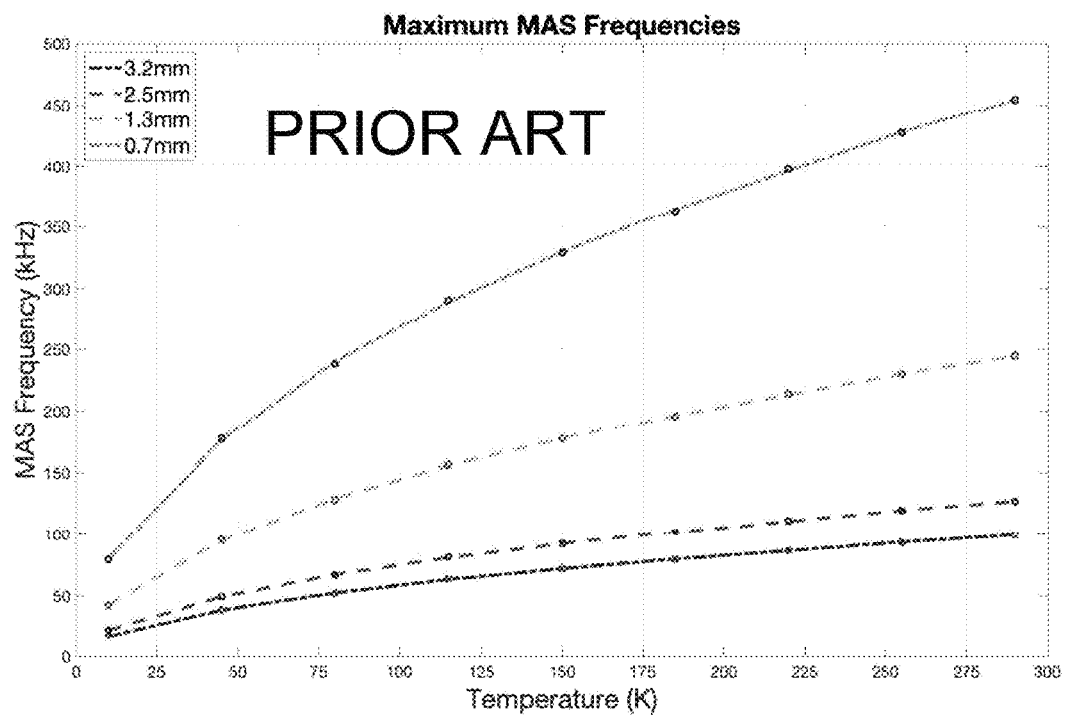
FIG. 1 is a prior art graph of maximum theoretical MAS frequency for various diameter rotors using helium gas.
Figure 2:
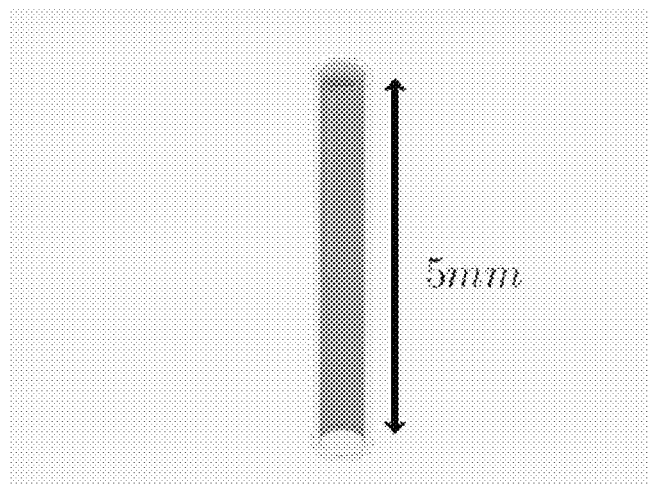
FIG. 2 shows a diagram of the diamond rotor

As stated, the resolution obtained in MAS NMR is greatly dependent upon the spinning frequency of the NMR rotor. [7] The spinning frequency of prior art rotors is limited by the tensile strength and flexural strength of the zirconia material used for fabricating rotors. Diamond, on the other hand, is one of the world's strongest materials with a Young's modulus of 1050 GPa and a tensile strength as high as 5190 MPa for chemical vapor deposition (CVD) grown diamonds.[13] As a result, diamond is an excellent choice for making MAS rotors and drive caps, as it is expected to be able to spin at higher frequencies than current state-of-the-art zirconia rotors. Furthermore, diamond is highly transparent to microwave irradiation making it an ideal choice for performing dynamic nuclear polarization (DNP) NMR measurements. FIG. 2 shows a schematic diagram of the diamond rotor. The outer diameter of the rotor can be between 0.1 mm to 4 mm, and the inner diameter can be between 10% to 90% of the outer diameter.

Although laser cutting can be employed to cut diamond sheets, that process does not produce the desired aspect ratio required for fabricating diamond rotors. The present invention relates to a laser process to micro-machine high aspect ratio microstructures in diamond. The method of the invention uses laser-induced graphitization of diamond followed by oxidation of newly formed graphite to fabricate high aspect ratio structures. Along the cut path, the diamond is first turned into graphite using a low-energy pulsed laser beam. Next, the graphite is oxidized into carbon dioxide using the laser in the presence of atmospheric oxygen. The high aspect ratio is achieved by selecting a wavelength with sufficiently low absorption to allow for a large optical penetration depth but still absorptive enough to cause sufficient heating.

Figure 3:
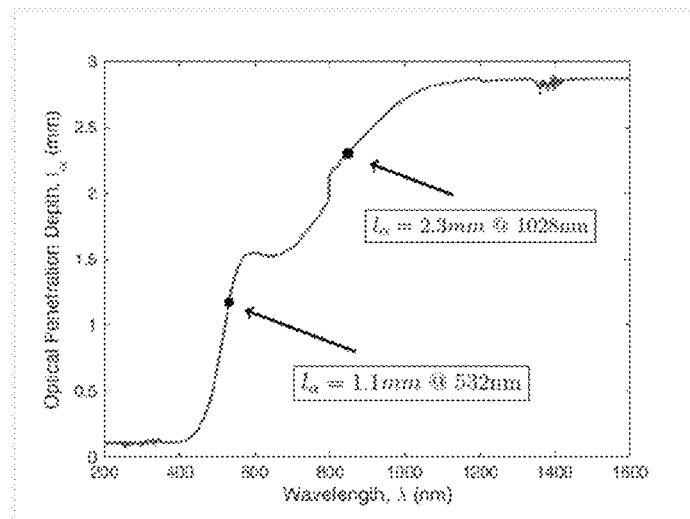
FIG. 3 shows the optical penetration depth of CVD diamond at 532 nm is 1.1 mm.

FIG. 3 shows the variation in optical penetration depth with respect to the wavelength. As can be seen, at a wavelength of 532 nm, the absorption is sufficiently low enough to allow for a deep optical penetration depth (approximately 1.1 mm), but still large enough to cause laser absorption and heating. Once the laser light is absorbed by the diamond, it causes a phase change resulting in graphitization of the diamond. Since, the absorption coefficient of the formed graphite is much greater than that of CVD diamond, there is a sudden increase in laser absorption as the diamond becomes graphite; this causes an immediate increase in temperature. The graphite is oxidized by ambient air to form carbon dioxide or carbon monoxide which immediately leaves. This leads to high material removal rates.

Figure 4A:
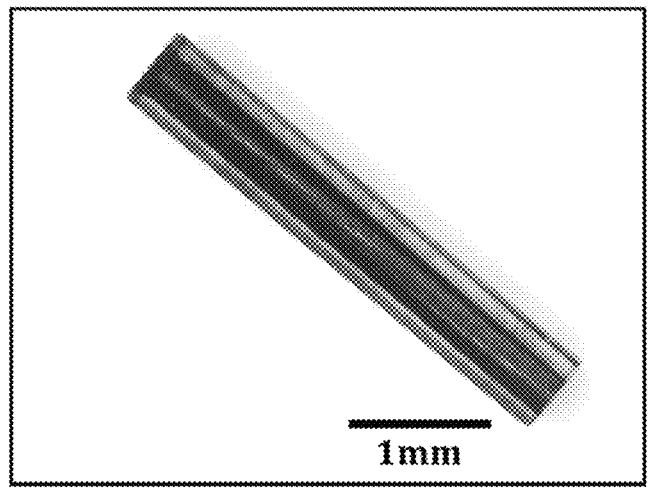
FIG. 4A shows a cross section of a diamond log with a machined through hole.

The preferred chemical vapor deposition (CVD) grown diamond sheets can be obtained from the company "Element Six". The laser micromachining is performed using a commercially available laser micromachining system from Oxford Ltd. The sheet is cut into small square logs and the rotors are fabricated by machining these logs. For laser micromachining the inner diameter, the log is mounted vertically on a rotary stage, and the laser micromachining is performed from one end to the other. The setup is equipped with mounts capable of adjusting the tilt and yaw of the stage. While the diamond log is undergoing rotation, the focus is gradually moved until the complete hole is drilled. FIG. 4A shows a picture of a log where the inner hole has been drilled.

Figure 4B:
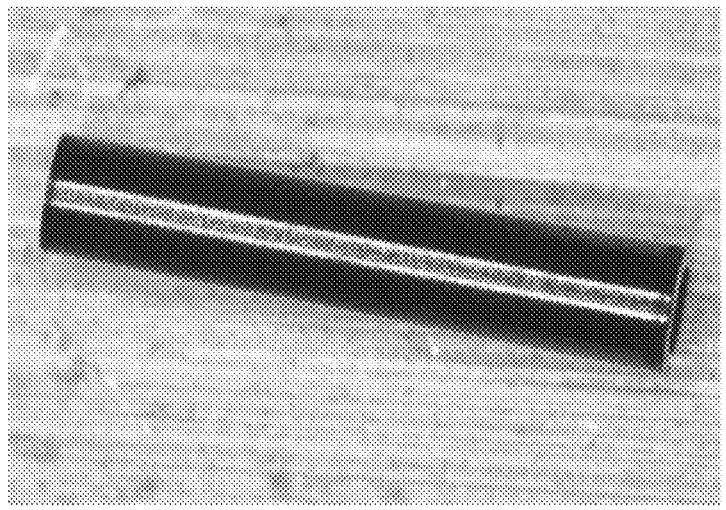
FIG. 4B shows a fully machined rotor where the outer diameter and inner diameter have been machined.
Figure 5:
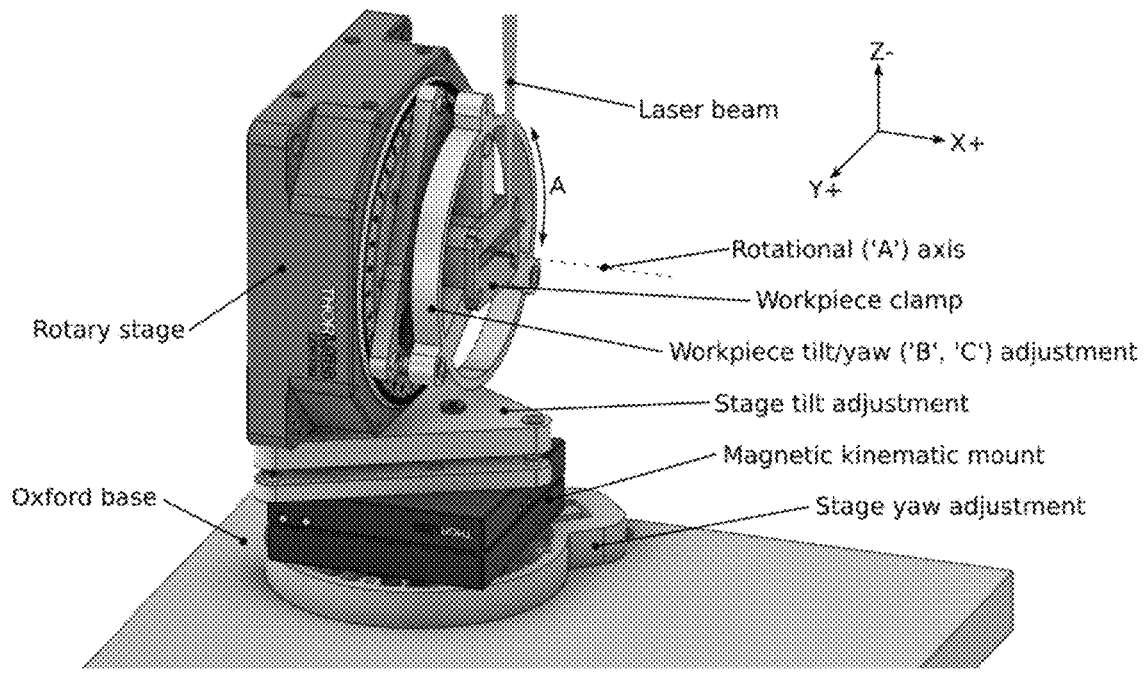
FIG. 5 shows a diagram of the mounting setup for machining the outer diameter of the rotor.

To machine the outer diameter two machining paths are available. The first is a top-down approach where the laser beam is used in a similar manner to the process of machining the inner diameter. In this approach the laser beam is positioned at the desired outer diameter of the log under rotation and the focus is gradually moved until a cylinder is formed. In the second approach the log is positioned on the rotary stage such that the laser is perpendicular to the top of the log. The laser then acts as a lathe passing along the outside edge of the rotor from one end to the other while the log is undergoing rotation. In both approaches tilt and yaw adjusters are again used to ensure that the laser makes a straight cut parallel to the axis of the center hole of the rotor. FIG. 4B shows the micromachined inner diameter and outer diameter of a typical diamond rotor. FIG. 5 shows an example of the laser machining setup for the micro-turning approach for machining the outer diameter of the rotor.

FIGS. 6-10 present flow charts of the process of the present invention to fabricate a diamond rotor for MAS NMR.

Figure 6:
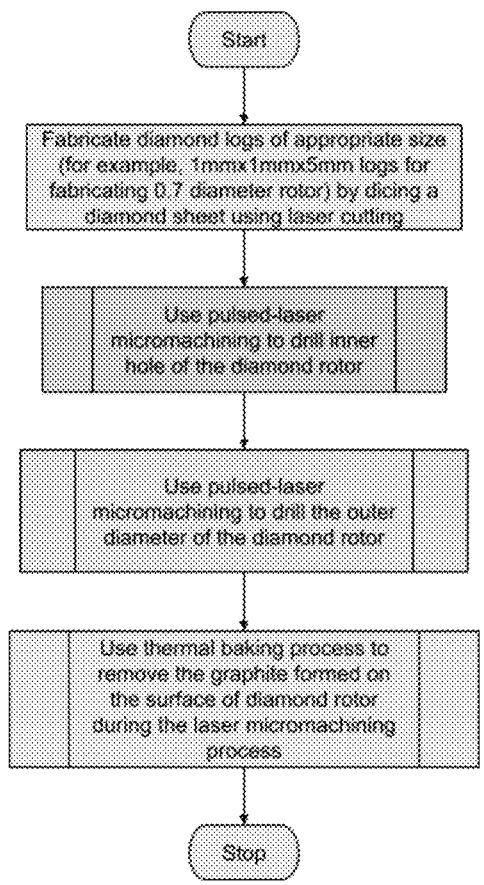
FIG. 6 is a flowchart of the overall process of making a diamond rotor.

FIG. 6 is a flowchart of the overall process. In step 1, to fabricate a 0.7 mm diameter rotor, at least one diamond log of dimensions approximately 1 mm×1 mm×5 mm is cut by dicing a larger piece of CVD diamond. A pulsed laser is tuned to the proper wavelength, and a round center passage is made through the log. The diamond log is then reoriented and the laser is used to machine the outer surface into a cylinder of the proper diameter. Finally, a thermal baking process is used where the diamond rotor is baked in a furnace at a temperature between 500-700° C. for a period of at least 24 hours.

Figure 7:
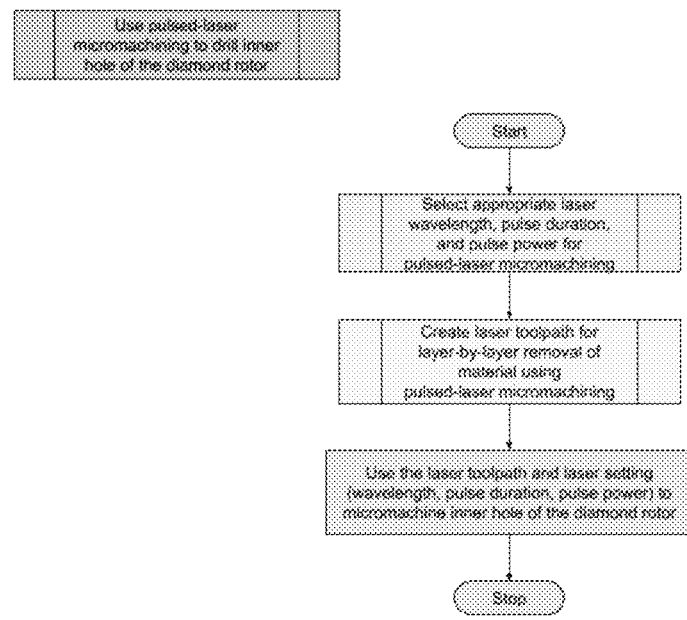
FIG. 7 is a flowchart of setting up the micromachining.

FIG. 7 is a flowchart for setting up pulsed-laser micromachining to drill the inner hole through the log. First, the appropriate laser wavelength and pulse duration is set up as well as the laser power. A laser toolpath is created for control of the laser during layer-by-layer removal of material during the hole drilling process. The laser is then used to micromachine the inner hole.

Figure 8:
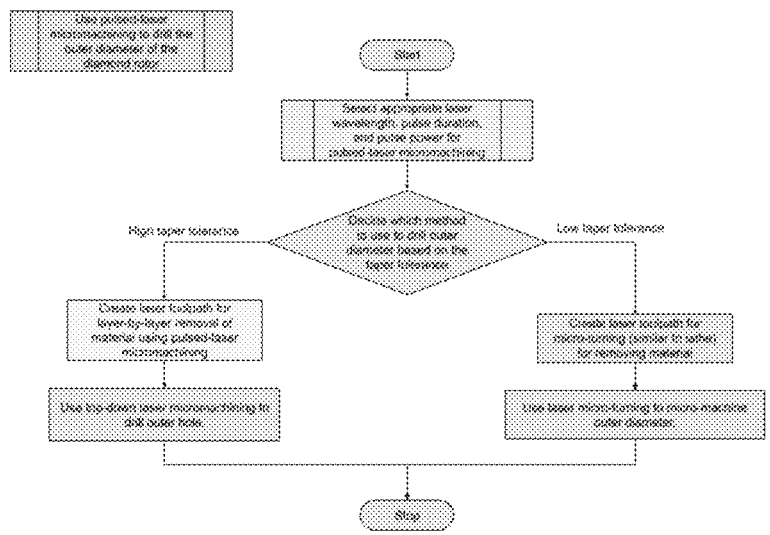
FIG. 8 is a flowchart of selection between a top-down laser machining approach and laser micro-turning approach for machining outer diameter of diamond rotor.

FIG. 8 is a flowchart showing the two possible operations for the outside diameter. The laser wavelength, pulse duration and power are first selected. Then, an appropriate tool path is set up for either machining the outer diameter with a top-down laser process, or micromachining the cylindrical surface by turning the log using a fixed laser beam position.

Figure 9:
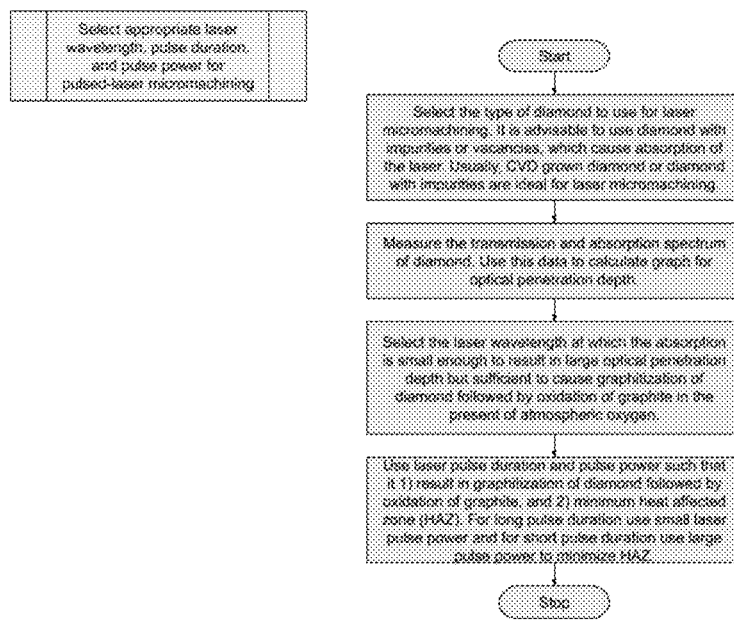
FIG. 9 is a flowchart of selecting the type of diamond and measuring absorption spectrum.

FIG. 9 is a flowchart for setting up the laser. First the type of diamond material is selected. It is advisable to use diamond with some impurities or vacancies. These properties increase absorption of the laser light. CVD grown diamonds generally possess the correct properties for this process and are the preferred diamond.

In any case, it is important to actually measure the transmission and absorption spectrum of the log or batch of logs being used. This can be done using standard equipment such as a UV/Vis spectrophotometer. The laser wavelength can then be selected so that the absorption is small enough to result in large optical penetration depth, but also small enough to cause enough energy absorption to convert the diamond in the path of the laser to graphite followed by oxidation in the present of ambient air.

The pulse duration and pulse power should be adjusted such that graphitization of the diamond takes place followed by oxidation of the graphite, and the minimum heat affected zone (HAZ) is small enough that a cylindrical tunnel can be made along the long length of the rotor of the desired diameter. If the HAZ is too large (either the power is too high, or the pulses are too long), the size of the hole can become too large.

Figure 10:
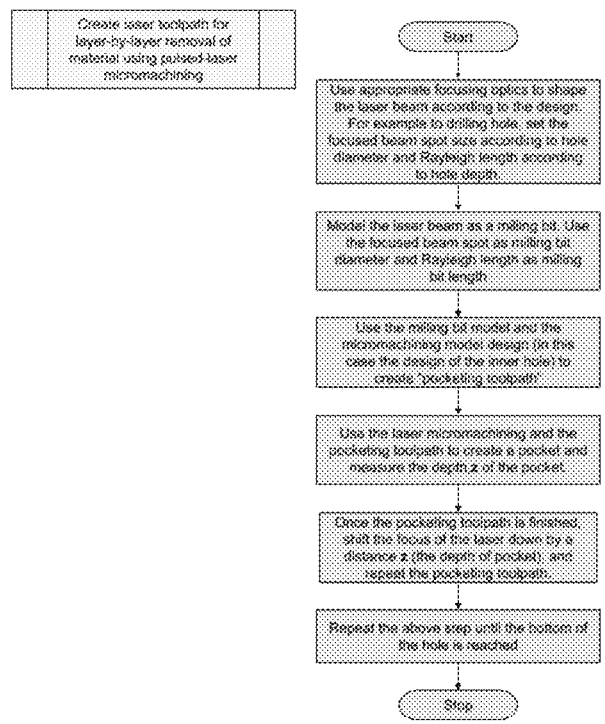
FIG. 10 is a flowchart of using the laser as a milling bit.

FIG. 10 is a flowchart showing the use of focusing optics during the micromachining process of the hole. In general, the focus of the laser beam can be accurately controlled. The focusing optics can shape the laser beam according to the design. For hole drilling, the focused beam spot size is set according to the desired hole diameter and Rayleigh length. The hole is drilled in small steps or pockets. When a pocket is finished, the depth of the focal point is moved downward to make the next pocket. The Rayleigh length determines the depth of the pocket. Each pocket should have a designed depth of z, a parameter chosen before drilling is started. A toolpath is created to create a single pocket at a particular depth. The first pocket starts at the top of the log and has depth z or coordinates from 0 to z. The second pocket has depth z and coordinates from z to 2z, etc. As each pocket is completed by the pocketing toolpath, the focus of the laser is shift down a distance z to form the next pocket. The process is repeated until the bottom of the hole is reached.

Several descriptions and illustrations have been presented to aid in the understanding of the present invention. One with skill in the art will realize that numerous changes and variations may be made without departing from the spirit of the invention. Each of these changes and variations is within the scope of the present invention.

REFERENCES

[1] T. P. J. Knowles, M. Vendruscolo, C. M. Dobson, The amyloid state and its association with protein misfolding diseases, Nature Reviews Molecular Cell Biology, 15 (2014) 384.
[2] H. Jang, J. Zheng, R. Lal, R. Nussinov, New structures help the modeling of toxic amyloidß ion channels, Trends in Biochemical Sciences, 33 (2008) 91-100.
[3] I. J. Lowe, Free Induction Decays of Rotating Solids, Physical Review Letters, 2 (1959) 285-287.
[4] E. R. Andrew, A. Bradbury, R. G. Eades, Nuclear Magnetic Resonance Spectra from a Crystal rotated at High Speed, Nature, 182 (1958) 1659-1659.
[5] C. P. Jaroniec, C. E. MacPhee, V. S. Bajaj, M. T. McMahon, C. M. Dobson, R. G. Griffin, High-resolution molecular structure of a peptide in an amyloid fibril determined by magic angle spinning NMR spectroscopy, Proceedings of the National Academy of Sciences of the United States of America, 101 (2004) 711.
[6] R. Tycko, Solid-state NMR studies of amyloid fibril structure, Annual review of physical chemistry, 62 (2011) 279-299.
[7] A. Bockmann, M. Ernst, B. H. Meier, Spinning proteins, the faster, the better?, Journal of Magnetic Resonance, 253 (2015) 71-79.
[8] T. Polenova, R. Gupta, A. Goldbourt, Magic Angle Spinning NMR Spectroscopy: A Versatile Technique for Structural and Dynamic Analysis of Solid-Phase Systems, Analytical Chemistry, 87 (2015) 5458-5469.
[9] S. Penzel, A. Oss, M.-L. Org, A. Samoson, A. Bockmann, M. Ernst, B. H. Meier, Spinning faster: protein NMR at MAS frequencies up to 126 kHz, Journal of biomolecular NMR, 73 (2019) 19-29.
[10] E. Bouleau, P. Saint-Bonnet, F. Mentink-Vigier, H. Takahashi, J. F. Jacquot, M. Bardet, F. Aussenac, A. Purea, F. Engelke, S. Hediger, D. Lee, G. De Paepe, Pushing NMR sensitivity limits using dynamic nuclear polarization with closed-loop cryogenic helium sample spinning, Chemical Science, 6 (2015) 6806-6812.
[11] W. H. Potter, APPARATUS TO ROTATE SAMPLES RAPIDLY AT TEMPERATURES LESS THAN 2 K IN HIGH TRANSVERSE MAGNETIC FIELDS, Rev. Sci. Instrum., 42 (1971) 618-&.
[12] J. E. Jensen, W. A. Tuttle, R. B. Stewart, H. Brechna, A. G. Prodell, Selected Cryogenic Data Notebook, in: D.o. Energy (Ed.), 1980.
[13] D. S. Olson, G. J. Reynolds, G. F. Virshup, F. I. Friedlander, B. G. James, L. D. Partain, Tensile strength of synthetic chemical-vapor-deposited diamond, Journal of Applied Physics, 78 (1995) 5177-5179.

We claim:

1. A method for micromachining a diamond rotor comprising:
   cutting a rectangular log of diamond using a diamond cutting process;
   drilling a hole lengthwise through the log using a pulsed laser with wavelength, pulse duration and pulse power sufficient to convert diamond to graphite and subsequently convert the graphite to carbon dioxide or carbon monoxide in ambient air;
   rotating the log in a laser beam to micromachine the log into a cylinder.

2. The method of claim 1 wherein the rotor has a final outside diameter between 0.1 mm and 4 mm and an inside diameter is between 10% to 90% of the outside diameter.

3. The method of claim 1 wherein the log has dimensions greater than the diamond rotor being machined.

4. The method of claim 1 wherein the wavelength is approximately 532 nm.

5. The method of claim 1 wherein the laser has a penetration depth of approximately 1.1 mm.

6. The method of claim 1 further comprising drilling the hole in steps, wherein each step creates a pocket of predetermined depth z mm.

7. The method of claim 6 further comprising increasing an optical focal point of the laser downward z mm as each pocket is completed until the hole totally penetrates the log.

8. The method of claim 1 wherein the diamond log is a chemical vapor deposition (CVD) diamond.

9. A method of micromachining a diamond rotor comprising:
   obtaining a sheet of chemical vapor deposition (CVD) grown diamond;
   measuring transmission and absorption of the diamond to determine optimum laser wavelength, pulse duration and pulse power;
   cutting from the sheet a rectangular log of diamond using a laser cutting process;
   mounting the rectangular log, and using a top-down pulsed laser with adjustable optical focal length, cutting a circular hole longitudinally through the log from a top end to a bottom end using the following steps:
   (a) Cutting a pocket of predetermined depth z with the laser by converting diamond material in the cut to graphite with the laser, and then oxidizing it to carbon dioxide by heat from the laser using oxygen from ambient air;
   (b) Moving focal length downward a distance z and repeating step (a) until a final pocket penetrates the bottom of the log to produce a drilled log;
   rotating the drilled log, micromachining the log into a cylinder using the laser to shave material from the log as it rotates.

10. The method of claim 9 wherein the rotor has a final outside diameter between 0.1 mm and 4 mm and the inside diameter is between 10% to 90% of the outside diameter.

11. The method of claim 9 wherein the log has dimensions greater than the diamond rotor being machined.

12. The method of claim 9 wherein the wavelength is approximately 532 nm.

13. The method of claim 9 wherein the laser has a penetration depth of approximately 1.1 mm.

14. The method of claim 9 wherein the diamond log is a chemical vapor deposition (CVD) diamond.

15. A method of laser drilling of diamond comprising:
   measuring a light transmission and absorption spectrum for a chosen diamond material;
   using the light transmission and absorption spectrum, choosing a laser wavelength, pulse duration and pulse power sufficient to convert the diamond to graphite;
   drilling a hole with the laser by converting diamond material in the hole to graphite and subsequently oxidizing it to carbon dioxide using oxygen from ambient air.

16. The method of claim 15 wherein the wavelength is approximately 532 nm.

17. The method of claim 15 wherein the laser has a penetration depth of approximately 1.1 mm.

18. The method of claim 15 further comprising drilling the hole in steps, wherein each step creates a pocket of predetermined depth z mm.

19. The method of claim 18 further comprising increasing an optical focal point of the laser downward z mm as each pocket is completed until the hole is completed.

* * * * *

UNITED STATES PATENT AND TRADEMARK OFFICE
CERTIFICATE OF CORRECTION

| | |
|---|---|
| PATENT NO. | : 11,999,006 B2 |
| APPLICATION NO. | : 17/098359 |
| DATED | : June 4, 2024 |
| INVENTOR(S) | : Patil et al. |

It is certified that error appears in the above-identified patent and that said Letters Patent is hereby corrected as shown below:

In the Specification

In Column 1, after Line 5 insert heading & paragraph:
--GOVERNMENT SUPPORT
This invention was made with government support under GM132079 and R01 GM132997 awarded by the National Institutes of Health. The government has certain rights in the invention.--

Signed and Sealed this
Eleventh Day of November, 2025

John A. Squires
*Director of the United States Patent and Trademark Office*